United States Patent [19]

Woo

[11] Patent Number: 5,264,745
[45] Date of Patent: Nov. 23, 1993

[54] RECOVERING PHASE AND DATA FROM DISTORTED DUTY CYCLES CAUSED BY ECL-TO-CMOS TRANSLATOR

[75] Inventor: Ann K. Woo, Cupertino, Calif.

[73] Assignee: Advanced Micro Devices, Inc., Sunnyvale, Calif.

[21] Appl. No.: 935,886

[22] Filed: Aug. 28, 1992

[51] Int. Cl.5 .............. H03K 19/0175; H03K 19/003
[52] U.S. Cl. ..................................... 307/475; 307/443
[58] Field of Search ................ 307/475, 443, 451; 375/22; 341/69

[56] References Cited

U.S. PATENT DOCUMENTS

| | | | |
|---|---|---|---|
| 4,140,980 | 2/1979 | Cummings | 375/22 |
| 4,798,981 | 1/1989 | Tsugaru et al. | 307/475 |
| 4,868,425 | 9/1989 | Lindenfelser | 307/475 |
| 4,958,132 | 9/1990 | Plants | 307/548 |

Primary Examiner—Edward P. Westin
Assistant Examiner—Benjamin D. Driscoll
Attorney, Agent, or Firm—Davis Chin

[57] ABSTRACT

A logic interface circuit for recovering phase and data information from ECL differential input signals of the NRZI type having distorted duty cycles caused by ECL-to-CMOS translators includes first and second ECL-to-CMOS translators (T1, T2), first and second delay circuits, and an output logic circuit. The first delay circuit is formed of a first inverter (I1), a first delay network (D1), and a first NAND logic gate (N1). The second delay network includes a second inverter (I2), a second delay network (D2), and a second NAND logic gate (N2). The output logic circuit is formed of a third NAND logic gate. The interface circuit generates an output signal which is in the form of a pulse train whose cycle time can be detected for determining the frequency information and whose presence or absence of pulses can be detected for determining data information.

19 Claims, 2 Drawing Sheets

RECOVERING PHASE AND DATA FROM DISTORTED DUTY CYCLES CAUSED BY ECL-TO-CMOS TRANSLATOR

BACKGROUND OF THE INVENTION

This invention relates generally to logic interface or conversion circuits and more particularly, it relates to a logic interface circuit which recovers phase and data from a data/frequency signal having distorted duty cycles caused by an ECL-to-CMOS translator.

As is generally well-known in the art, various types of digital logic circuitry are widely used in the area of computer data processing systems in different parts of the processing system. In order to transfer data from one part of the processing system having one logic type (i.e., ECL) of integrated circuit devices to another part having another logic type (i.e., CMOS) of integrated circuit devices, there is often required a translation from one logic type to the other type since they have different switching speeds and the input/output voltages corresponding to high and low logic levels are different.

For example, bipolar emitter-coupled logic (ECL) voltage levels have a small voltage swing (about 0.8 volts) and complementary metal-oxide semiconductor (CMOS) voltage levels have a larger voltage swing (approximately 5.0 volts. Since many of these processing systems are designed with both ECL and CMOS logic circuits, there are required interface circuits such as ECL-to-CMOS translators so that these two different types of logic circuits will be compatible with each other. In other words, the ECL-to-CMOS translators are used to shift the level of the ECL input logic signals to a level which will be recognized by the CMOS logic circuits.

Unfortunately, because of variations in process parameter, power supply, temperature and manufacturing tolerances, such ECL-to-CMOS translators that perform the conversion will not, in many cases, provide the desired, symmetrical CMOS output signal $V_{out1}$ having equal rise and fall times as shown in FIG. 1(b). The actual CMOS output signal $V_{out2}$ will become distorted or non-symmetrical as shown in FIG. 1(c). When the ECL input signal is in the form of ECL differential input signals $V_{in+}$ and $V_{in-}$ of FIG. 1(a), which are used to carry both data information and the clock frequency of a system referred to sometimes as a "Non Return to Zero, Invert on Ones" (NRZI) or data/frequency signal, the non-symmetry in the CMOS output signal caused by the translator will result in inaccurate detection of the clock frequency.

Accordingly, there are has arisen a need in the industry to provide a logic interface circuit which recovers phase and data from a data/frequency signal having distorted duty cycles caused by an ECL-to-CMOS translator. The logic interface circuit of the present invention receives ECL differential input signals of the NRZI type and generates an output signal which is CMOS compatible so that both data and frequency information can be easily extracted separately.

SUMMARY OF THE INVENTION

Accordingly, it is a general object of the present invention to provide a logic interface circuit which is relatively simple and economical to manufacture and assemble.

It is an object of the present invention to provide a logic interface circuit which recovers phase and data from a data/frequency signal having distorted duty cycles caused by an ECL-to-CMOS translator.

It is another object of the present invention to provide a logic interface circuit for receiving ECL differential input signals of the NRZI type and for generating an output signal which is CMOS compatible so that both data and frequency information can be easily extracted separately.

It is still another object of the present invention to provide a logic interface circuit which is formed of an input stage having first and second translators, a first intermediate stage, a second intermediate stage, and an output logic stage.

In accordance with these aims and objectives, the present invention is concerned with the provision of a logic interface circuit for receiving ECL differential signals and for generating an output signal which is CMOS compatible so that both data and frequency information can be easily extracted separately. The logic interface circuit includes a first translator, a second translator, a first delay circuit, a second delay circuit, and an output logic circuit. The first translator is responsive to the ECL differential input signals and generates a first CMOS output signal. The second translator is also responsive to the ECL differential input signals and generates a second CMOS output signal which is complementary to the first CMOS output signal.

The first delay circuit is responsive to the first CMOS output signal and a first delayed signal for generating a first pulse-width control signal. The second delay circuit is responsive to the second CMOS output signal and a second delayed signal for generating a second pulse-width control signal. The output logic circuit is responsive to the first and second pulse-width control signals for generating the output signal which is in the form of a pulse train whose cycle time can be detected for determining the frequency information and whose presence or absence of pulses can be detected for determining data information.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
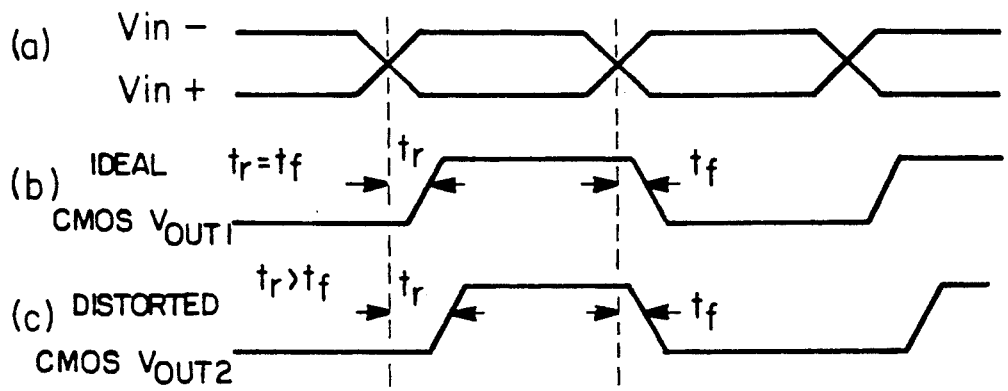
FIGS. 1(a)–1(c) show ECL differential input signals, an ideal CMOS output signal, and a distorted CMOS output signal, respectively.
Figure 2:
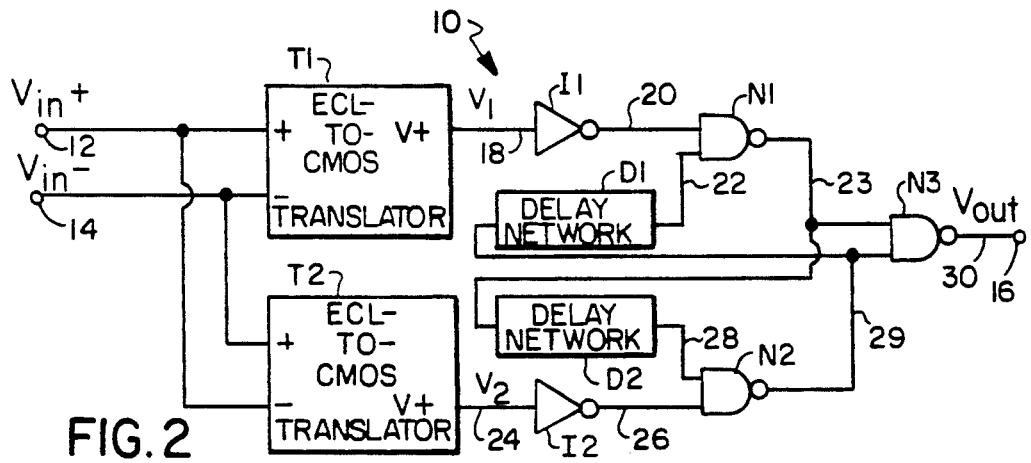
FIG. 2 is a schematic circuit diagram of a logic interface circuit, constructed in accordance with the principles of the present invention.

Referring now in detail to the drawings, there is illustrated in FIG. 2 a schematic circuit diagram of a logic interface circuit 10 of the present invention for receiving ECL differential input signals and for generating an output signal which is CMOS compatible so that both data and frequency information can be easily extracted separately. The ECL differential input signals $V_{in+}$ and $V_{in-}$ are in the form of a "Non Return to Zero Invert on Ones" (NRZI) or data/frequency signal which carries both data information and the clock frequency of the system. In other words, the data information is considered to be a logic "1" each time the input signal $V_{in+}$ ($V_{in-}$) makes either a transition from a low (L) level to a high (H) level (such as at time t1 in FIG. 3(a)) or from a high (H) level to a low (L) level (such as at time t5). Further, the clock frequency is determined by measuring the time between successive logic "1's" (i.e., between time t3 and t7 in FIG. 3(d)).

Figure 3:
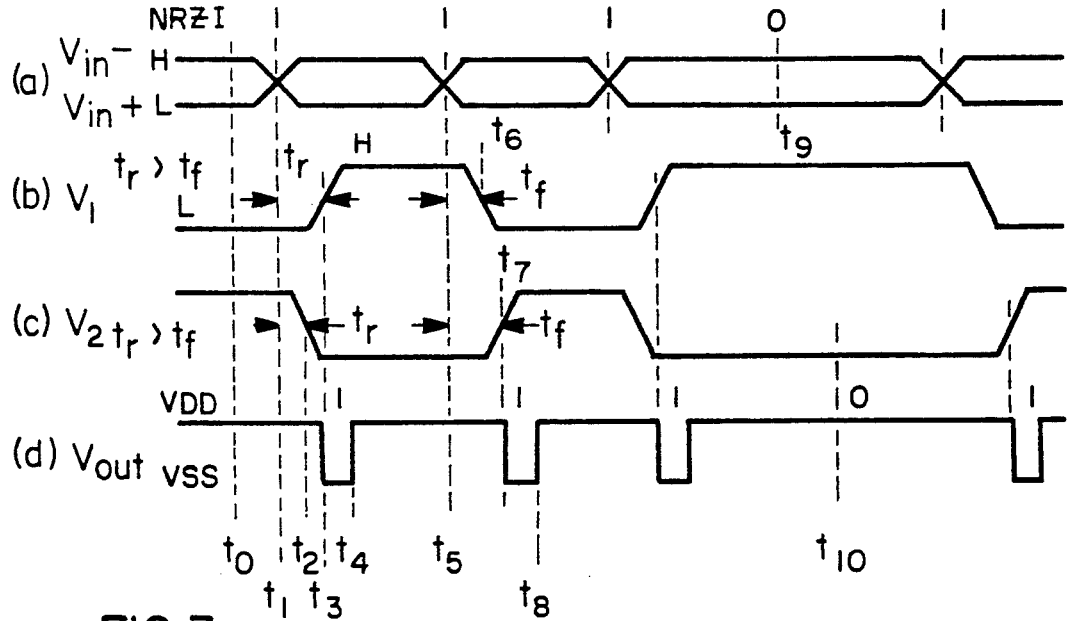
FIGS. 3(a) through 3(d) are waveforms at various points in the circuit of FIG. 2, useful in understanding the operation of the present invention.

The logic interface circuit 10 has first and second input terminals 12 and 14 for receiving the respective ECL differential input signals $V_{in+}$ and $V_{in-}$, as illustrated in FIG. 3(a). The input signals $V_{in+}$ and $V_{in-}$ have a small voltage swing of approximately 800 mV. The logic interface circuit 10 further has an output terminal 16 for producing the CMOS output signal $V_{out}$ in FIG. 3(d) which has a full voltage swing from a lower supply potential at a first supply voltage or potential VSS to an upper supply potential at a second supply voltage or potential VDD. Typically, the lower supply potential is 0 volts, and the upper supply potential is at approximately +5.0 volts ±10% for conventional CMOS logic.

Figure 4:
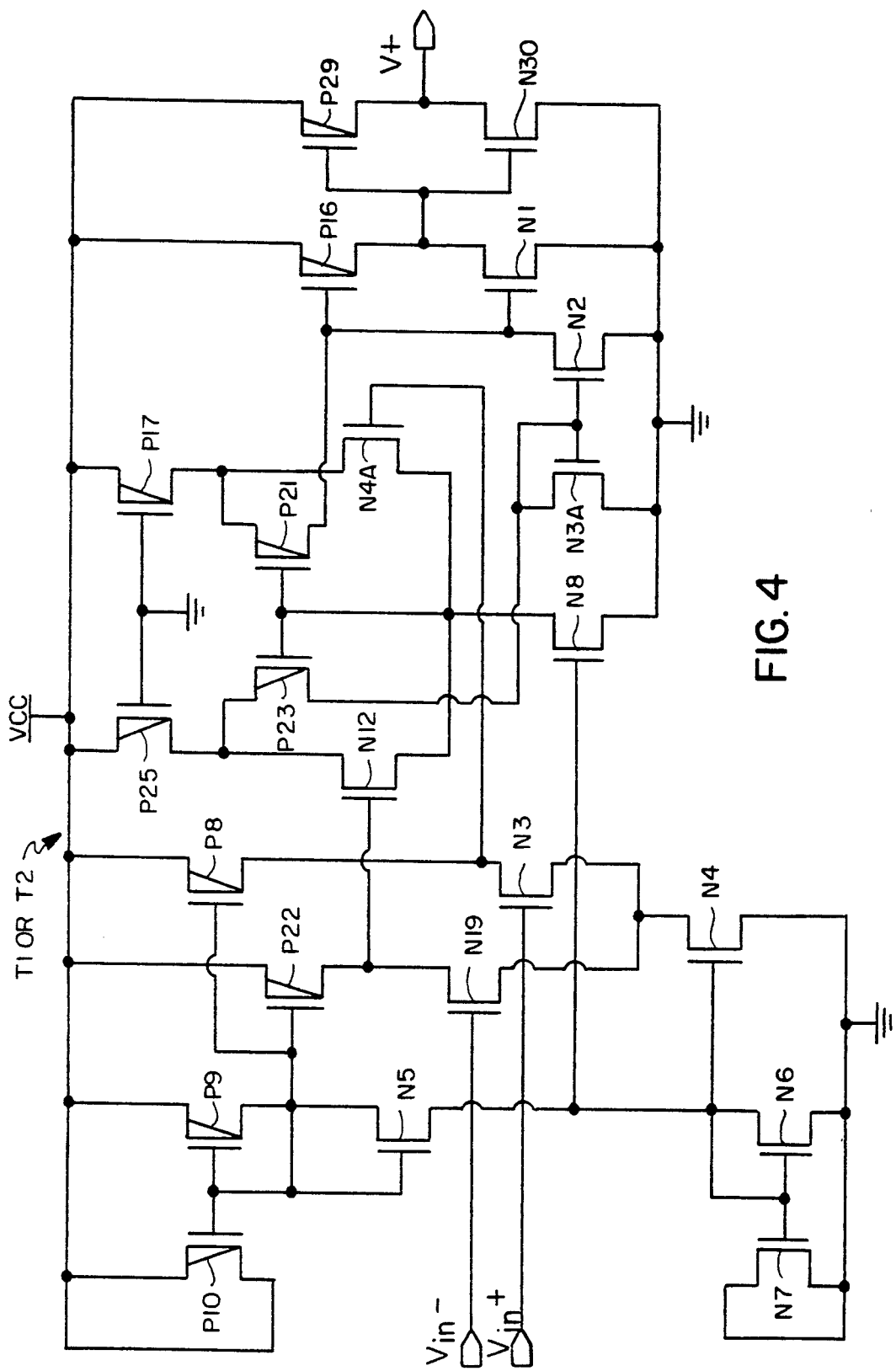
FIG. 4 is a detailed schematic circuit diagram of an ECL-to-CMOS translator for use in the translator T1 or T2 of FIG. 2.

The logic interface circuit 10 includes an input stage formed of a first ECL-to-CMOS translator T1 and a second ECL-to-CMOS translator T2. The translators T1 and T2 are identical and are of a conventional design. A detailed schematic circuit diagram of the translator T1 or T2 is shown in FIG. 4. The first translator T1 has its first input node (+) connected to the first input terminal 12 for receiving the ECL input signal $V_{in+}$ and its second input terminal (−) connected to the second input terminal 14 for receiving the ECL input signal $V_{in-}$. The first translator T1 has an output node (V+) for generating a first CMOS output signal $V_1$ which is depicted in FIG. 3(b). It will be noted that the output signal $V_1$ is assumed to be distorted in which the rise time $t_r$ is greater than the fall time $t_f$. As previously pointed out, this non-symmetry is caused by the different characteristics existing in the ECL-to-CMOS translator T1.

Similarly, the second translator T2 has its first input node (+) connected to the second output terminal 14 for receiving the ECL input signal $V_{in-}$ and its second input node (−) connected to the first input terminal 12 for receiving the ECL input signal $V_{in+}$. The second translator T2 has an output node (V+) for generating a second CMOS output signal $V_2$ which is shown in FIG. 3(c). As can be seen by comparing FIGS. 3(b) and 3(c), the second CMOS output signal $V_2$ is complementary to the first CMOS output signal $V_1$. In other words, when the output signal $V_1$ is at the high (H) level the output signal $V_2$ will be at the low (L) level and vice-versa.

The logic interface circuit 10 further includes a first intermediate stage formed of a first inverter I1, a first delay network D1, and a first NAND logic gate N1 and a second intermediate stage formed of a second inverter I2, a second delay network D2, and a second NAND logic gate N2. The first inverter I1 has its input on line 18 connected to receive the first CMOS output signal $V_1$ and has its output on line 20 fed to a first input of the first NAND logic gate N1. A second input on line 22 of the logic gate N1 is connected to the output of the first delay network D1. The output on line 23 of the logic gate N1 is connected to the input of the second delay network D2.

The second inverter I2 has its input on line 24 connected to receive the second CMOS output signal $V_2$ and has its output on line 26 fed to a first input of the second NAND logic gate N2. A second input on line 28 of the logic gate N2 is connected to the output of the second delay network D2. The output on line 29 of the logic gate N2 is connected to the input of the first delay network D1. It should be understood that the delay networks D1 and D2 are of an identical construction so as to provide equal delay times. Each of the delay networks may be formed of a pair of conventional inverters or a plurality of even number of inverters.

The interface logic circuit further includes an output stage formed of a third NAND logic gate N3. The logic gate N3 has its first input connected also to the output of the first logic gate N1 and has its second input connected also to the output of the second logic gate N2. The output on line 30 of the third logic gate N3 is connected to the output terminal 16 for producing the output signal $V_{out}$ from which the data information and frequency information can be determined or sensed by standard circuit elements (not shown).

The operation of the logic interface circuit 10 will now be explained with reference to the waveform diagrams depicted in FIGS. 3(a)-3(d) which are useful in understanding of this invention constructed as described above. It will be initially assumed that the ECL input signal $V_{in+}$ is at a low (L) level and that the ECL input signal $V_{in-}$ is at a high (H) level at time t0, as illustrated in FIG. 3(a). As a result, the first CMOS output signal $V_1$ will be at the low (L) level and the second CMOS output signal $V_2$ will be at the high (H) level, as shown in respective FIGS. 3(b) and 3(c).

Thus, the output of the inverter I2 will be low which, in turn, causes the output of the second logic gate N2 to be high. This high, after a delay by the delay network D1, defines a first delayed signal and is fed to the second input of the first logic gate N1. Since the output of the inverter I1 is also high, this causes the output of the first logic gate N1 to be low. This low, after a delay by the delay network D2, defines a second delayed signal and is fed to the second input of the second logic gate N2. With the first input of the logic gate N3 being low, the output signal $V_{out}$ at the output of the third logic gate N3 will be at a high (H) level at the time t0, as depicted in FIG. 3(d).

As can be seen at the time t1 in FIG. 3(a), the ECL input signal $V_{in+}$ is making a high-to-low transition and the ECL input signal $V_{in-}$ is making a low-to-high transition. This indicates a data information corresponding to a logic "1." Since the rise time $t_r$ is assumed to be greater than the fall time $t_f$ the second CMOS output signal $V_2$ will make a high-to-low transition at time t2 prior to the first CMOS output signal $V_1$ making a low-to-high transition at time t3. At the time t3, the output of the first inverter I1 will go low causing the output of the first logic gate N1 defining a first pulse-width control signal to be high. As a result, the output signal $V_{out}$ will go low at this time t3.

Since the high at the output of the first logic gate N1 is being delayed by a predetermined amount of time in the second delay network D2, the first input on line 28 of the second logic gate N2 will remain low until after the predetermined amount of time has lapsed and will then go high. This high will cause the output of the second logic gate N2 to go low. Consequently, at the time t4 the output signal $V_{out}$ will be reset back to the high (H) level.

Similarly, at the time t5 in FIG. 3(a), the ECL input signal $V_{in+}$ is making a low-to-high transition and the ECL input signal $V_{in-}$ is making a high-to-low transition. This indicates again a data information corresponding to a logic "1." The first CMOS output signal $V_1$ will make a high-to-low transition at time t6 prior to the second CMOS input signal $V_2$ making a low-to-high transition at time t7 since $t_r > t_f$. At the time t7, the output of the second inverter I2 will go low causing the output of the second logic gate N2 defining a second pulse-width control signal to be high. As a result, the output signal $V_{out}$ will go low again at this time t7.

Since the high at the output of the second logic gate N2 is delayed by a predetermined amount of time in the first delay network D1, the second input on line 22 of the first logic gate N1 will remain low until after this predetermined amount of time has lapsed and will then go high. This high will cause the output of the first logic gate N1 to go low. Consequently, at the time t8 the output voltage $V_{out}$ will be reset back to the high level again.

As can be seen at time t9 in FIG. 3(a), the ECL input signals $V_{in+}$ and $V_{in-}$ are not changed. This indicates a data information corresponding to a logic "0." Further, the CMOS output signals $V_1$ and $V_2$ will also remain unchanged at the time t9 in respective FIGS. 3(b) and 3(c). Thus, the output signal $V_{out}$ at time t10 in FIG. 3(d) will likewise stay high (H).

Accordingly, it will be noted that the present logic interface circuit 10 detects the cycle time or phase of the distorted CMOS output signals $V_1$ and $V_2$ in spite of their unequal rise and fall times by generating a low going edge (high-to-low transition) in the output signal $V_{out}$. For example, these low going edges are shown at the times t3 and t7 in FIG. 3(d). The pulse width of the output signal $V_{out}$ is determined by the time duration or delay times (i.e., between times t3 and t4) in the delay networks D1 and D2. Therefore, by synchronizing the low going edges of the output signal $V_{out}$ with a conventional timing circuit, such as a phase-locked loop (PLL) or a timing ruler, the period between two successive low going edges can be measured and thus the clock frequency of the system can be easily recovered. Further, by sensing the presence or absence of the low going edge within sampling bit times in the train of pulses in the output signal $V_{out}$, the data information corresponding to either a logic "1" or "0" can be detected.

From the foregoing detailed description, it can thus be seen that the present invention provides a logic interface circuit for recovering phase and data from a data/frequency signal having distorted cycle time or phase caused by an ECL-to-CMOS translator. The logic interface circuit includes first and second ECL-to-CMOS translators, first and second delay means, and an output logic circuit. The interface circuit generates an output signal which is CMOS compatible so that both data and frequency information can be easily extracted separately.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A logic interface circuit for receiving ECL differential signals and for generating an output signal which is CMOS compatible so that both data and frequency information can be easily extracted separately, said interface circuit comprising:

first translator means responsive to the ECL differential input signals for generating a first CMOS output signal;

second translator means responsive also to the ECL differential input signals for generating a second CMOS output signal which is complementary to said first CMOS output signal;

first delay means responsive to said first CMOS output signal and a first delayed signal for generating a first pulse-width control signal;

second delay means responsive to said second CMOS output signal and a second delayed signal for generating a second pulse-width control signal; and output logic means responsive to said first and second pulse-width control signals for generating the output signal which is in the form of a pulse train whose cycle time can be detected for determining the frequency information and whose presence or absence of pulses can be detected for determining data information.

2. A logic interface circuit as claimed in claim 1, wherein said first translator means comprises a first ECL-to-CMOS translator (T1).

3. A logic interface circuit as claimed in claim 2, wherein said second translator means comprises a second ECL-to-CMOS translator (T2).

4. A logic interface circuit as claimed in claim 1, wherein said first delay means is comprised of a first inverter (I1), a first delay network (D1), and a first NAND logic gate (N1).

5. A logic interface circuit as claimed in claim 4, wherein said second delay means is comprised of a second inverter (I2), a second delay network (D2), and a second NAND logic gate (N2).

6. A logic interface circuit as claimed in claim 5, wherein said first NAND logic gate (N1) has its first input connected to the output of said first inverter (I1) and its second input connected to the output of said first delay network (D1), said second NAND logic gate (N2) having its first input connected to the output of said second inverter (I2) and its second input connected to the output of said second delay network (D2), said first delay network (D1) having its input connected to the output of said second NAND logic gate (N2) and said second delay network (D2) having its input connected to the output of said first NAND logic gate (N1).

7. A logic interface circuit as claimed in claim 5, wherein said first and second delay networks (D1, D2) are each comprised of a pair of inverters to provide equal delay times.

8. A logic interface circuit as claimed in claim 5, wherein said first and second delay networks (D1, D2)

are each comprised of a plurality of even number of inverters to provide equal delay times.

9. A logic interface circuit as claimed in claim 5, wherein said output logic means is comprised of a third NAND logic gate (N3), said third NAND logic gate (N3) having its first input connected to the output of said first NAND logic gate (N1) and its second input connected to the output of said second NAND logic gate (N2), the output of said third NAND logic gate (N3) providing the output signal.

10. A logic interface circuit as claimed in claim 1, wherein said first and second CMOS output signals are non-symmetrical with unequal rise and fall times.

11. A logic interface circuit for recovering phase and data from a data/frequency signal having distorted duty cycles caused by an ECL-to-CMOS translator, said interface circuit comprising:
  input stage means responsive to ECL differential input signals for generating a first CMOS output signal and a second CMOS output signal which is complementary to said first CMOS output signal;
  first intermediate stage means responsive to said first CMOS output signal and a first delayed signal for generating a first pulse-width control signal;
  second intermediate stage means responsive to said second CMOS output signal and a second delay signal for generating a second pulse-width control signal and
  output logic means responsive to said first and second pulse-width control signals for generating an output signal which is CMOS compatible so that both data and frequency information can be extracted separately.

12. A logic interface circuit as claimed in claim 11, wherein said input stage means is comprised of first and second ECL-to-CMOS translators (T1, T2).

13. A logic interface circuit as claimed in claim 12, wherein said first intermediate stage means is comprised of a first inverter (I1), a first delay network (D1), and a first NAND logic gate (N1).

14. A logic interface circuit as claimed in claim 13, wherein said second intermediate stage means is comprised of a second inverter (I2), a second delay network (D2), and a second NAND logic gate (N2).

15. A logic interface circuit as claimed in claim 14, wherein said first NAND logic gate (N1) has its first input connected to the output of said first inverter (I1) and its second input connected to the output of said first delay network (D1), said second NAND logic gate (N2) having its first input connected to the output of said second inverter (I2) and its second input connected to the output of said second delay network (D2), said first delay network (D1) having its input connected to the output of said second NAND logic gate (N2) and said second delay network (D2) having its input connected to the output of said first NAND logic gate (N1).

16. A logic interface circuit as claimed in claim 15, wherein said first and second delay networks (D1, D2) are each comprised of a pair of inverters to provide equal delay times.

17. A logic interface circuit as claimed in claim 15, wherein said first and second delay networks (D1, D2) are each comprised of a plurality of even number of inverters to provide equal delay times.

18. A logic interface circuit as claimed in claim 15, wherein said output logic means is comprised of a third NAND logic gate (N3), said third NAND logic gate (N3) having its first input connected to the output of said first NAND logic gate (N1) and its second input connected to the output of said second NAND logic gate (N2), the output of said third NAND logic gate (N3) providing the output signal.

19. A logic interface circuit as claimed in claim 11, wherein said first and second CMOS output signals are non-symmetrical with unequal rise and fall times.

* * * * *